United States Patent
Jaklitsch et al.

(10) Patent No.: US 10,012,694 B2
(45) Date of Patent: Jul. 3, 2018

(54) ENHANCING SPECTRAL PURITY IN HIGH-SPEED TESTING

(71) Applicant: AAI Corporation, Hunt Valley, MD (US)

(72) Inventors: James Joseph Jaklitsch, Parkton, MD (US); Jay Michael Markey, York, PA (US)

(73) Assignee: AAI Corporation, Hunt Valley, MD (US)

( * ) Notice: Subject to any disclaimer, the term of this patent is extended or adjusted under 35 U.S.C. 154(b) by 0 days.

(21) Appl. No.: 15/139,659

(22) Filed: Apr. 27, 2016

(65) Prior Publication Data

US 2017/0315173 A1    Nov. 2, 2017

(51) Int. Cl.
*G01R 31/317*    (2006.01)
*G01R 31/3177*   (2006.01)
*G01R 31/319*    (2006.01)
*G01R 15/12*     (2006.01)

(52) U.S. Cl.
CPC ....... *G01R 31/31708* (2013.01); *G01R 15/12* (2013.01); *G01R 31/3177* (2013.01); *G01R 31/3191* (2013.01); *G01R 31/31703* (2013.01); *G01R 31/31901* (2013.01)

(58) Field of Classification Search
CPC .................. G01R 31/31708; G01R 31/3177
See application file for complete search history.

(56) References Cited

U.S. PATENT DOCUMENTS

| 5,272,446 | A | * | 12/1993 | Chalmers ............. G01R 23/165 |
|---|---|---|---|---|
| | | | | 329/304 |
| 5,343,404 | A | | 8/1994 | Girgis |
| 5,673,289 | A | | 9/1997 | Kim et al. |
| 6,108,454 | A | * | 8/2000 | Nevis ...................... G06T 5/10 |
| | | | | 382/255 |
| 6,211,663 | B1 | | 4/2001 | Moulthrop et al. |
| 6,341,123 | B1 | * | 1/2002 | Tsujishita ............... H04H 40/18 |
| | | | | 370/210 |
| 8,160,163 | B1 | * | 4/2012 | Yucek .................. H04L 27/0006 |
| | | | | 375/246 |
| 2004/0108953 | A1 | | 6/2004 | Chevalier et al. |
| 2005/0248374 | A1 | | 11/2005 | Kushnick |
| 2008/0158029 | A1 | * | 7/2008 | Xu ........................ H03M 1/0626 |
| | | | | 341/120 |
| 2013/0018613 | A1 | | 1/2013 | Chow |
| 2014/0036631 | A1 | | 2/2014 | Saito et al. |

FOREIGN PATENT DOCUMENTS

WO    2008039422 A2    4/2008

* cited by examiner

*Primary Examiner* — Joseph D Torres
(74) *Attorney, Agent, or Firm* — BainwoodHuang

(57) ABSTRACT

A technique for testing an electronic UUT by a test apparatus includes obtaining multiple DFTs of a test signal received from the UUT with the test apparatus configured differently for obtaining each DFT. The resulting DFTs include both valid content representing the test signal and invalid content introduced by the test apparatus. The improved technique suppresses the invalid content by generating a corrected DFT, which provides minimum magnitude values for corresponding frequencies relative to the test signal across the multiple DFTs.

10 Claims, 5 Drawing Sheets

ENHANCING SPECTRAL PURITY IN HIGH-SPEED TESTING

BACKGROUND

Conventional techniques for testing an electronic unit under test, or "UUT," involve directing the UUT to generate an output signal, measuring the output signal, and determining whether the output signal is within acceptable limits. If the output signal falls within acceptable limits and no other failures occur, testing usually passes. Otherwise, testing may fail. UUTs may come in many varieties and are often provided in the form of semiconductor chips, devices, components, and assemblies, for example.

Some UUTs are designed to operate in the RF (Radio Frequency) and/or microware frequency ranges. Such UUTs may generate output signals at high frequencies, such as many megahertz or gigahertz. A conventional system for testing an RF or microware UUT includes a downconverter configured as a super-heterodyne receiver. For example, the downconverter includes a local oscillator that generates a high-frequency signal, generally referred to as a local oscillator signal, or simply "LO." A mixer combines the LO with the test signal from the UUT to generate an output signal. The output signal from the mixer includes both an upper frequency band and a lower frequency band, which correspond to the sum and difference, respectively, of frequencies between the LO and the test signal. One or more filters may select one band (usually the lower band) and block the other band. An analog-to-digital converter (ADC) digitizes the filtered signal, e.g., by sampling the filtered signal at a sufficiently high rate to capture frequency content of interest. A processor obtains the samples from the ADC and performs a DFT (Discrete Fourier Transform). A test program analyzes the DFT to determine whether it meets acceptable limits, e.g., for spectral purity, signal-to-noise ratio, expected amplitudes at expected frequencies, and so forth. Given that systems often test UUTs for spectral purity and noise, a very pure and stable local oscillator is often used, such as a YIG (Yttrium-Iron-Garnet) oscillator.

SUMMARY

YIG oscillators are highly stable and can be tuned to produce a wide range of LO frequencies. Unfortunately, however, YIG oscillators can also have long settling times, e.g., on the order of milliseconds in response to changes in tuning frequency. Long settling times can present an obstacle to high-speed testing. For instance, to test certain UUTs, a test system may effectively sweep or step LO frequency to sample multiple frequency ranges and to obtain multiple DFTs, one for each frequency range. Long YIG settling times may impair such testing, however, as a test program has to wait for the YIG to settle after each tuning change before sampling can proceed.

Faster-settling sources of high-frequency signals are available, such as direct digital synthesizers (DDS's). DDS's may have settling times on the order of nanoseconds, but they are known to produce parasitic effects, such as harmonics and/or spurs. Such parasitic effects may impair the spectral purity of LO signals and thus the spectral purity of signals input to the ADC. A test system using a DDS may thus be degraded in its ability to distinguish UUTs that meet their requirements from those that do not. What is needed is a way to use a DDS or other fast-settling local oscillator for performing high-speed testing of UUTs without degrading the quality of testing.

In contrast with prior approaches, an improved technique for testing an electronic UUT by a test apparatus includes obtaining multiple DFTs of a test signal received from the UUT with the test apparatus configured differently for obtaining each DFT. The resulting DFTs include both valid content representing the test signal and invalid content introduced by the test apparatus. The improved technique suppresses the invalid content by generating a corrected DFT, which provides minimum magnitude values for corresponding frequencies relative to the test signal across the multiple DFTs.

Advantageously, the improved technique enables fast-settling frequency sources, such as DDS's, to be used as local oscillators when testing UUTs without sacrificing test quality. Thus, it is not necessary to choose between high spectral purity and high speed when testing RF or microwave UUTs. Rather, by using the improved technique, both high spectral purity and high speed can be achieved together.

According to some examples, the improved technique obtains a DFT at each of two LO frequencies from a DDS or other source. Invalid frequency content introduced by a local oscillator, such as intermodulation components, produce magnitude values that differ at corresponding frequencies between the DFTs. Providing minima of frequency components at corresponding frequencies effectively suppresses the invalid frequency content in reported results.

According to some examples, the improved technique obtains a DFT at each of two different levels of input attenuation. Such levels may be established, for example, by adjusting a variable attenuator in line with the test signal. Invalid frequency content introduced by amplifiers and other elements in the test apparatus (e.g., as a result of saturation, clipping, etc.) produce components that differ between the two DFTs. The improved technique suppresses such invalid frequency content in reported results by providing minima of magnitudes at corresponding frequencies, e.g., after compensating for attenuation differences.

In some examples, multiple DFTs are taken, reflecting both different LO frequencies and different attenuations, such that invalid content associated with both LO frequency and attenuation may be suppressed.

Certain embodiments are directed to a method of testing an electronic UUT (Unit Under Test) by a test apparatus. The method includes receiving a test signal from the UUT and generating multiple DFTs (Discrete Fourier Transforms) of the test signal obtained with the test apparatus arranged in multiple respective configurations. Each of the DFTs produce a set of magnitude values at a set of frequency values, and the multiple DFTs including both valid content and invalid content. The method further includes generating a test result based on a corrected DFT. The corrected DFT includes multiple corrected magnitude values, each corrected magnitude value generated by (i) identifying a respective set of magnitude values, one for each of the multiple DFTs, that relate to the same respective test signal frequency and (ii) computing a minimum of that set of magnitude values. The corrected DFT thereby suppresses at least some of the invalid content in the multiple DFTs in response to such invalid content changing across the multiple configurations.

Other embodiments are directed to a test apparatus including an input terminal and a controller, coupled to the input terminal. The controller is constructed and arranged to perform a method of testing an electronic UUT (Unit Under Test), such as the method described above.

Still further embodiments are directed to a computer program product including a set of non-transitory, computer-readable media having instructions which, when executed by a controller, cause the controller to perform a method of testing an electronic UUT (Unit Under Test), such as the method described above.

The foregoing summary is presented for illustrative purposes to assist the reader in readily understanding example features presented herein and is not intended to be limiting.

BRIEF DESCRIPTION OF THE SEVERAL VIEWS OF THE DRAWINGS

The foregoing and other features and advantages will be apparent from the following description of particular embodiments of the invention, as illustrated in the accompanying drawings, in which like reference characters refer to the same or similar parts throughout the different views. The drawings are not necessarily to scale, emphasis instead being placed upon illustrating the principles of various embodiments of the invention. In the accompanying drawings.

DETAILED DESCRIPTION OF THE INVENTION

Embodiments of the invention will now be described. It is understood that such embodiments are provided by way of example to illustrate various features and principles of the invention, and that the invention hereof is broader than the specific example embodiments disclosed.

An improved technique for testing an electronic UUT by a test apparatus includes obtaining multiple DFTs of a test signal received from the UUT with the test apparatus that is configured differently for obtaining each DFT. The improved technique suppresses invalid content in the DFTs by generating a corrected DFT, which provides minimum magnitude values for corresponding frequencies relative to the test signal across the multiple DFTs.

Figure 1:
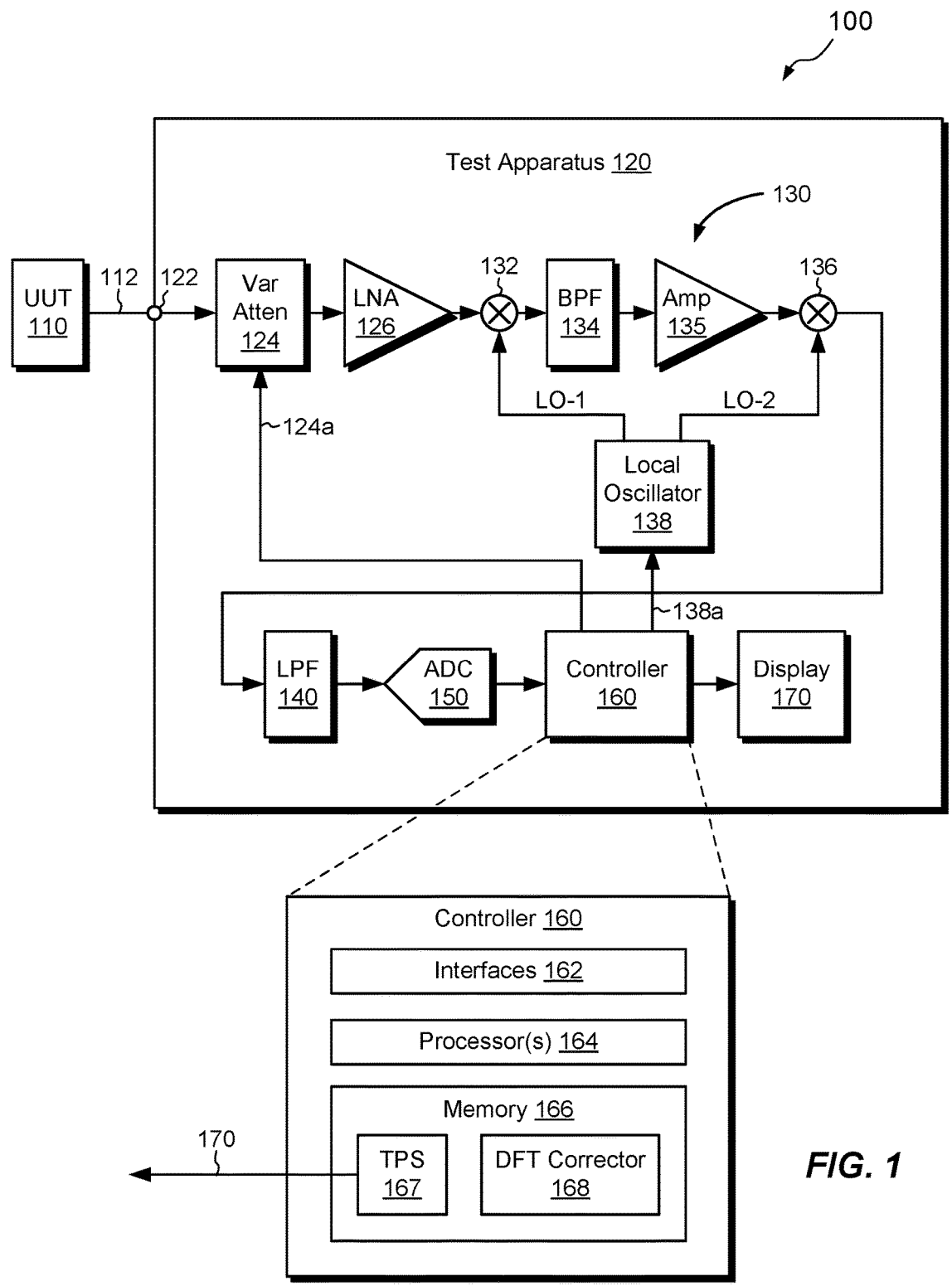
FIG. 1 is a block diagram of an example testing environment in which embodiments of the improved technique hereof can be practiced.

FIG. 1 shows an example testing environment 100 in which embodiments of the improved technique hereof can be practiced. Here, a UUT 110 is coupled to a test apparatus 120, which is configured to test the UUT 110, e.g., by running a TPS (Test Program Set) 167 on the UUT 110. The UUT 110 may connect to the test apparatus 120 via a test fixture (not shown), and equipment may be provided to feed multiple UUTs to the test fixture, e.g., to enable the test apparatus 120 to test the UUTs rapidly in succession.

As further shown in FIG. 1, the test apparatus 120 has an input terminal 122, which is configured to connect (directly or indirectly) to the UUT 110, such that the test apparatus 120 may receive a test signal 112 from the UUT. In various examples, the input terminal 122 is provided as a coaxial connector, a waveguide connector, or other type of connector, which preserves signal integrity and avoids excessive reflections. The test apparatus 120 further includes a variable attenuator 124 and a low-noise amplifier (LNA) 126. The variable attenuator 124 may be provided as a step attenuator, as a set of discrete attenuators which are individually selectable and/or selectable in groups, as a continuously variable attenuator, or as any other attenuator or group of attenuators configured to reduce the power of the test signal 112 by different amounts. In a particular example, the variable attenuator 124 is implemented as an electronically-controlled step attenuator, which provides different attenuation levels in response to changes in an electronic control signal 124a.

As further shown, the test apparatus 120 includes a downconverter 130, a low-pass filter (LPF) 140, an analog-to-digital converter (ADC) 150, a controller 160, and a display 170. The downconverter 130 is arranged as a super-heterodyne receiver for translating high frequencies to lower frequencies that are more practical and convenient to measure. In the particular example shown, the downconverter 130 includes a first mixer 132, a bandpass filter (BPF) 134, an amplifier 135, a second mixer 136, and a local oscillator 138. The local oscillator 138 may be implemented as a DDS (Direct Digital Synthesizer) or other fast-settling, variable-frequency source. Although only a single bandpass filter 134 is shown, in some examples multiple bandpass filters are provided, effectively in parallel, for selectively passing one frequency band at a time while blocking others. It should be understood that the particular arrangement of elements shown in the test apparatus 120 is merely an example. For instance, alternative arrangements may provide only a single mixer, greater than two mixers, and/or multiple local oscillators, as well as various other attenuators, amplifiers and filters.

In an example, the controller 160 includes interfaces 162, a set of processing units 164, and memory 166. The interfaces 162 include digital interfaces, e.g., to the ADC 150 and to the display 170, as well as control outputs to the variable attenuator 124 (124a) and the local oscillator 138 (138a). The set of processing units 164 include one or more processing chips and/or assemblies. The memory 166 includes both volatile memory (e.g., RAM), and non-volatile memory, such as one or more ROMs, disk drives, solid state drives, and the like. The controller 160 is constructed and arranged to carry out various methods and functions as described herein. Also, the memory 166 includes a variety of software constructs realized in the form of executable instructions. When the executable instructions are run by the set of processing units 164, the set of processing units 164 are caused to carry out the operations of the software constructs. Although certain software constructs are specifically shown and described, it is understood that the memory 166 typically includes many other software constructs, which are not shown, such as an operating system, various applications, processes, and daemons.

The memory 166 is seen to "include," i.e., realize by operation of executable instructions, a TPS (Test Program Set) 167 and a DFT corrector 168. The TPS 167 orchestrates and directs testing activities conducted by the test apparatus 120 for testing the UUT. The DFT corrector 168 works in coordination with the TPS 167 to suppress invalid frequency content introduced by the test apparatus 120. For example, the TPS 167 directs the test apparatus 120 to acquire DFTs of test signals produced by UUTs and coordinates with the DFT corrector 168 to remove spurs and harmonics introduced by the test apparatus 120. The TPS 167 generates a test result 170, such as a pass/fail result and/or diagnostic output, at the conclusion of testing, to indicate whether the UUT 110 passes or fails.

In example operation, the UUT 110 is connected to the test apparatus 120 and the controller 160 arranges the test apparatus 120 in a first configuration. For example, the controller 160 sends control signal 124a to the variable attenuator 124 to direct the variable attenuator 124 to select an initial level of attenuation. The controller 160 also sends control signal 138a to the local oscillator 138 to direct the local oscillator 138 to generate initial output frequencies LO-1 and LO-2. Frequencies LO-1 and LO-2 preferably are based on the same timing reference. Ideally, LO-1 and LO-2 are pure tones; however, in practice, with the local oscillator 138 implemented with a DDS or other fast-settling source, LO-1 and LO-2 are not precisely pure tones but instead include spurs and/or harmonics in addition to the desired content.

The test apparatus 120 applies power and in some cases stimuli (not shown) to the UUT 110, and the UUT responds by outputting the test signal 112. The test signal 112 includes high frequencies, ranging, for example, from the megahertz range up to hundreds of gigahertz or higher. The test apparatus 120 receives the test signal 112 at the input terminal 122, and the variable attenuator 124 attenuates the test signal 112 by the amount specified by the control signal 124a. The LNA 126 amplifies the attenuated test signal. It should be appreciated that the output of the LNA 126 may itself introduce parasitic frequency content. For example, the LNA 126 may generate harmonics of frequencies in the test signal 112 if it is driven beyond its safe input amplitude limits.

The output of the LNA 126 is conveyed to the downconverter 130. The first mixer 132 mixes the output of the LNA 126, received at one input of the mixer 132, with LO-1, received at the other input of the mixer 132, to produce an output. The output of the mixer 132 includes sum and difference frequency bands. The BPF 134 selects one frequency band and passes the selected band to the amplifier 135. The second mixer 136 mixes the output of the amplifier 135 with LO-2, again producing sum and difference frequency bands. The LPF 140 filters out the high frequencies and passes the lower frequencies to the ADC 150 (e.g., from the difference band). The ADC 150 samples the output of the LPF 140 at a high sampling rate (e.g., hundreds of megahertz) to capture and digitize the downconverted and filtered test signal 112. The controller 160 stores the acquired samples in the memory 166.

With the samples thus acquired, the controller 160 generates a first DFT of the acquired samples. The controller 160 may generate the first DFT using an FFT (Fast Fourier Transform), although this is not required. It should be appreciated that the first DFT includes both valid frequency content of the test signal 112 and invalid frequency content, which arises as a result of spurs and/or harmonics introduced by the local oscillator 138, LNA 126, and/or other elements of the test apparatus 120.

In accordance with improvements hereof, the controller 160 changes the configuration of the test apparatus 120 and proceeds to acquire a second DFT of the test signal 112 in the new configuration. For example, the controller 160 changes the configuration by directing the local oscillator 138 to change the frequencies of LO-1 and LO-2. The changes in frequency need not be great, provided they are large enough to move the frequency components as they appear in the two DFTs by an amount greater than the frequency resolution of the first and second DFTs. The second DFT thus provides a slightly different "view" of the test signal 112, and the different views can be compared to remove parasitic effects. Any parasitic components introduced by the local oscillator 138 tend to change with changes in LO frequencies, such that changing the LO frequencies LO-1 and LO-2 tend to move these parasitic components in the resulting DFTs. Thus, if the first DFT shows a frequency component at a particular frequency relative to test signal 112 but the second DFT does not, it can be assumed that the frequency component in the first DFT is a spur or harmonic that was introduced by the test apparatus 120, rather than being a component actually present in the test signal 112 (note that some level of consistency in the test signal 112 itself is assumed).

The DFT corrector 168 may then proceed to generate a corrected DFT having multiple corrected magnitude values. Each corrected magnitude value is generated by (i) identifying a respective set of magnitude values that relate to the same test signal frequency and (ii) computing a minimum of that set of magnitude values. For example, the DFT corrector 168 aligns the first DFT with the second DFT to enable direct comparisons between corresponding pairs of magnitude values. Alignment may be needed because changing the center frequency between the first configuration and the second configuration may cause the same frequencies of the input signal 112 to appear shifted in the second DFT. The DFT corrector 168 may align the DFTs, for example, by specifying an offset frequency between them, which corresponds to the change in center frequency. Comparisons of magnitude values may then proceed in pairs by comparing magnitude values in the first DFT with offset magnitude values in the second DFT. For each pair of magnitude values, the DFT corrector 168 computes a minimum of the two magnitude values and provides the computed minimum value in the corrected DFT.

In an example, the sampling rate of ADC 150 is the same when acquiring samples for the first DFT as it is when acquiring samples for the second DFT. As the sampling rates are the same for the two DFTs, so too are the frequency intervals between consecutive frequency components for the two DFTs (i.e., the frequency resolution). Further, the difference in center frequency between the first and second configurations preferably equals an integer number of such frequency intervals. Thus, for example, if consecutive frequency components in the first DFT are separated by 1 Hz, then consecutive frequency components in the second DFT are also separated by 1 Hz and the difference in center frequency between the first configuration and the second configuration is an integer multiple of 1 Hz (e.g., 1 Hz, 2 Hz, 3 Hz, 100 Hz, etc.).

The controller 160 may also (or alternatively) change the configuration of the test apparatus 120 by changing the attenuation level of the variable attenuator 124. For example, the controller 160 applies control signal 124a to increase the attenuation level of the variable attenuator 124, which reduces the power of the test signal 112 by a greater amount. The controller 160 directs another DFT to be generated, and the DFT corrector 168 compares the two DFTs taken with the different attenuation levels. As before, the DFT corrector 168 identifies sets of magnitude values between or among DFTs, aligns the DFTs in frequency (if necessary), and computes a corrected magnitude as the minimum of each set. Note that if no change is made in center frequency between or among the DFTs, the act of aligning DFTs may be omitted, as the DFTs are already aligned. In some examples, one of the two DFTs used in this example may be normalized for power level within respect to the other prior to computing minima, to account for different magnitudes resulting from the different attenuation levels.

Given this example, the DFT corrector 168 tends to correct parasitic content introduced as a result of the test signal 112 being too large, as the DFT taken with the greater attenuation level will tend to contain fewer harmonics. If required, attenuation of the step attenuator 124 may be increased even further, with one or more additional DFTs acquired, until further increasing the attenuation level provides no further reduction in parasitic content.

The two approaches described above, one based on changing frequency of the local oscillator 138 and the other based on changing attenuation of the variable attenuator 124, may be used separately or together and in any suitable fashion. For example, a first DFT may be taken as a baseline, with a second DFT taken to reflect a change in LO frequency and a third DFT taken to reflect a change in attenuation. Alternatively, the first DFT may be the baseline and the second DFT may reflect a change in both LO frequency and attenuation, or only in attenuation. All permutations of configuration changes and orders of operation are contemplated.

When acquiring greater than two DFTs, comparisons among DFTs may be made for all DFTs together at once, rather than pairwise. For example, three or more DFTs may be taken. Such DFTs may be aligned in frequency (if necessary) to form corresponding sets of magnitude values. The DFTs are normalized in magnitude (if necessary) to compensate for differences in attenuation. Then the adjusted DFTs are then compared, with a minimizing function performed on each respective set of magnitude values and applied to all magnitude values in each respective set. The resulting minimum magnitude values provide the magnitude values of the corrected DFT.

A result of the above-described operation is a corrected DFT that accurately represents the test signal 112 and suppresses or removes entirely parasitic components introduced by a DDS or other fast-settling source. The described technique thus achieves both high quality of test and high-speed testing operation.

Although operation is described above for testing a single frequency band of the test signal 112, such operation may be repeated for different frequency bands, e.g., by changing LO frequencies and passbands of the BPF 134 to bring other frequency bands of the test signal 112 into range of the ADC 150. Given that the test signal 112 may extend over a large number of frequency bands, the benefits of using a fast-settling local oscillator (e.g., a DDS) become amplified, again without incurring the penalty in terms of parasitic content normally associated with such fast-settling local oscillators.

Figure 2:
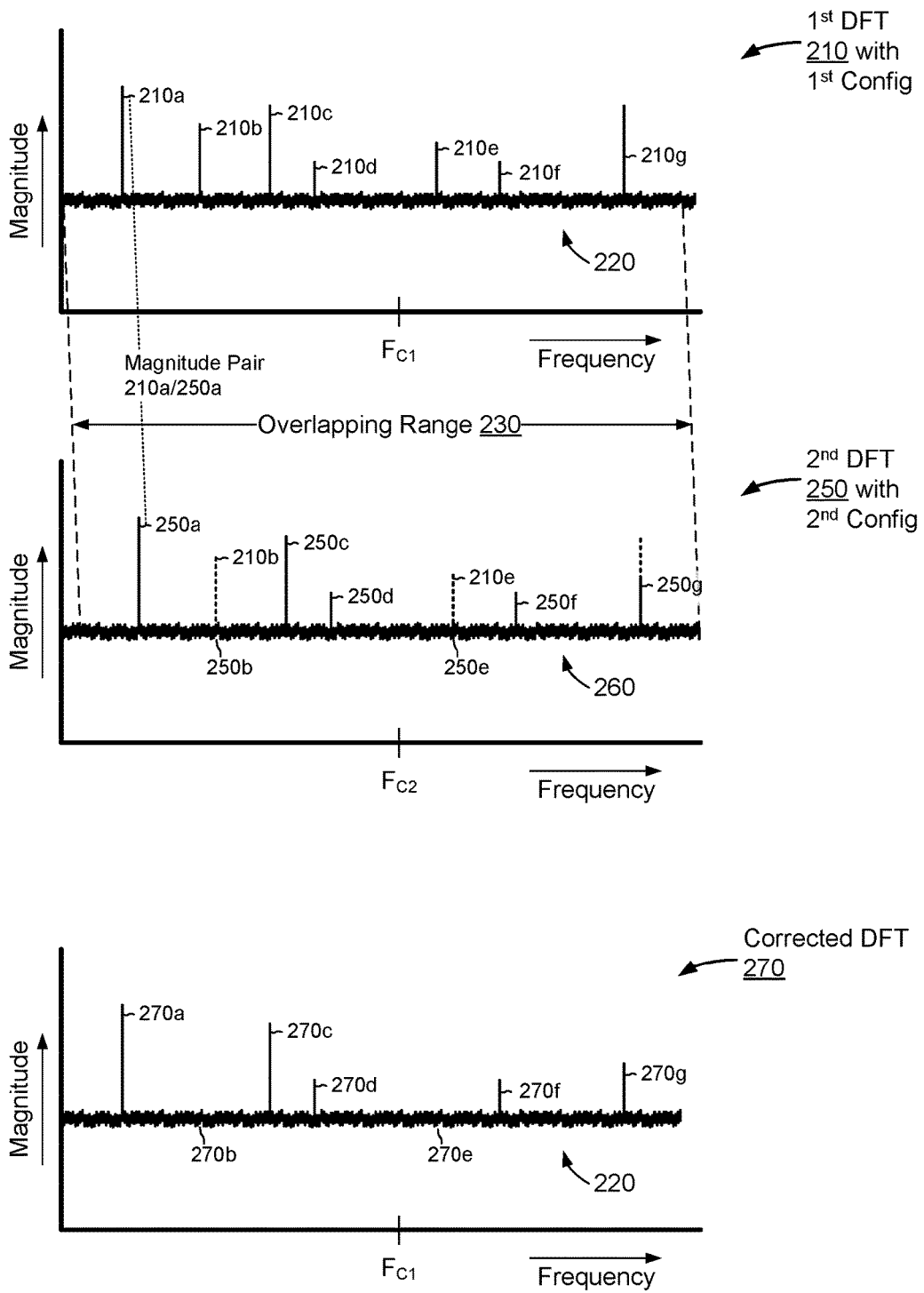
FIG. 2 shows example screen shots of a first DFT obtained with a first test apparatus configuration, a second DFT obtained with a second test apparatus configuration, and a corrected DFT.

FIG. 2 shows examples of DFTs generated in accordance with the above-described technique. Here, three different DFTs are shown, a first DFT 210 taken with the test apparatus 120 in a first configuration, a second DFT 250 taken with the test apparatus 120 in a second configuration, and a corrected DFT 270. In this example, the first configuration corresponds to a first frequency setting of the local oscillator 138, which provides first frequencies of LO-1 and LO-2, and the second configuration corresponds to a second frequency setting of the local oscillator 138, which provides second frequencies of LO-1 and LO-2.

The first DFT 210 is seen to extend over a range of discrete frequencies, shown along the horizontal axis, with each discrete frequency having a corresponding magnitude value. Discrete frequency increases from left to right, and magnitude increases from bottom to top. The magnitude axis is logarithmic and the frequency axis is linear. The first DFT 210 is seen to have a center frequency $F_{C1}$, which is mid-way between the lowest (leftmost) discrete frequency and the highest (rightmost) discrete frequency shown. As can be seen, most of the magnitude values in the first DFT 210 fall within a noise floor 220. Extending up from the noise floor 220 are magnitude values 210a through 210g. Given the first DFT alone, it cannot be known whether these magnitude values are actual or parasitic, or which ones are actual and which ones are parasitic.

The second DFT 250 is seen to extend over a slightly shifted range of discrete frequencies. By changing the frequencies of LO-1 and LO-2, the second DFT 250 is made to have a center frequency $F_{C2}$ that is slightly different (lower, in this case) than $F_{C1}$. The shift in center frequency is small enough so that frequencies of interest remain in view. In an example, other aspects of the second DFT 250 are kept the same as those of the first DFT 210. For instance, both DFTs may include the same number of samples and may be computed using the same technique. Further, both DFTs are acquired from samples taken by the ADC 150 at the same sampling rate. The second DFT 250 has a noise floor 260.

Although the frequency ranges covered by the first DFT 210 and the second DFT 250 differ, the two DFTs include an overlapping range 230. Within the overlapping range 230, each discrete frequency in the first DFT 210 corresponds to a respective discrete frequency in the second DFT 250, and vice-versa. Further, each magnitude value in the first DFT 210 forms a magnitude pair with the corresponding magnitude value in the second DFT 250. One such magnitude pair is shown, associating magnitude value 210a with magnitude value 250a. It should be appreciated, however, that each magnitude value within the overlapping range 230 in the first DFT 210 forms a respective magnitude pair with a corresponding magnitude value in the second DFT 250, i.e., there are as many magnitude pairs as there are discrete frequencies in the overlapping range 230. Further, it should be appreciated that each magnitude pair corresponds to a respective discrete frequency. Thus, for example, the magnitude pair 210a/250a corresponds to a single discrete frequency. This is the case even though this frequency appears at different locations in the pictured graphs of the two DFTs, as the graphs are shifted relative to each other in frequency.

Some of the frequency components in the first DFT 210 are seen to have vanished from the second DFT 250, while others remain. For example, components 210b and 210e appear now in the noise floor 260 in the second DFT 250, with dotted lines indicating their phantom locations.

To generate the corrected DFT 270, the DFT corrector 168 computes a corrected magnitude for each magnitude pair in the overlapping region 230. For example, as further shown in FIG. 2, the components 210b and 210e in the first DFT 210 each exceed the corresponding components in 250b and 250e in the second DFT 250. Consequently, the DFT corrector 178 generates corrected magnitudes 270b and 270e, where magnitude 270b is the minimum of magnitudes 210b and 250b and magnitude 270e is the minimum of magnitudes 210e and 250e.

Correction can take place in the reverse direction, as well. For instance, and although not shown, the second DFT 250 may include a parasitic component that is absent from the first DFT 210. In such cases, the DFT corrector 178 may use the corresponding magnitude value from the first DFT 210, i.e., the minimum of the two.

The examples described above pertain to a situation in which parasitic (invalid) components are distinct from actual (valid) components. However, there is also a possibility that that same frequency component may have both a valid portion, reflecting actual content of the test signal 112, and an invalid portion, reflecting parasitic content introduced by the test apparatus 120. Component 210g is one such component. Here, the component 210g appears much larger in the first DFT 210 than it does in the corresponding component 250g in the second DFT 250. Here this, the DFT corrector 168 generates a corrected frequency component 270g as the minimum of the components 210g and 250g.

The corrected DFT 270 is thus a cleaner version of the first DFT 210, with parasitic components introduced by the local oscillator 138 substantially removed. The corrected DFT 270 thus provides a more accurate basis for testing the UUT 110 than does the first DFT 210 without correction.

Figure 3:
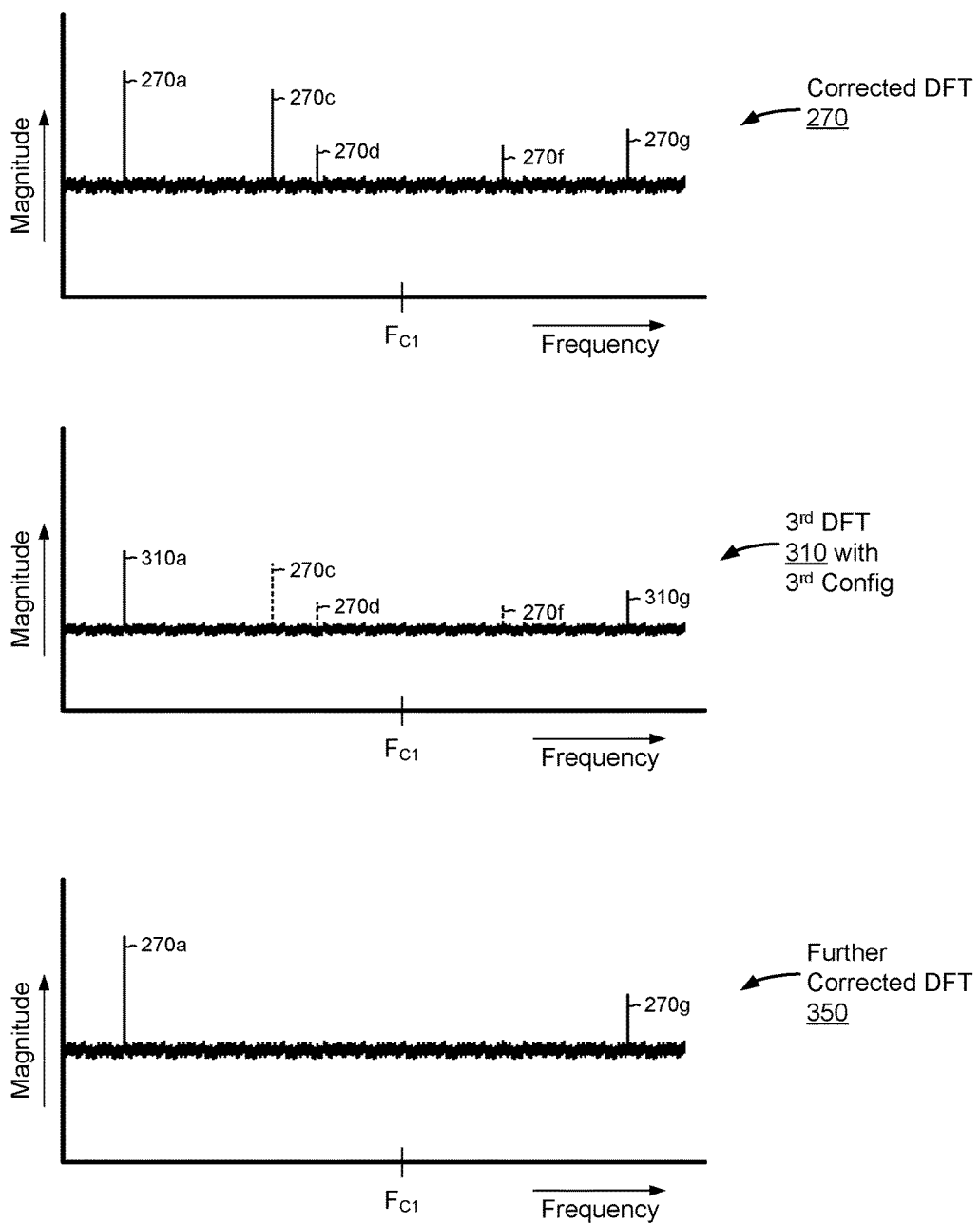
FIG. 3 shows example screen shots of a corrected DFT, a third DFT obtained with a third test apparatus configuration, and a further corrected DFT.

FIG. 3 shows further examples of DFT correction in accordance with improvements hereof. Here, the corrected DFT 270 is further corrected by taking a third DFT 310. The controller 160 obtains the third DFT 310 by arranging the test apparatus 120 in a third configuration, in which the variable attenuator 124 is configured to provide a higher level of attenuation than the one that was used when obtaining the samples for the first DFT 210 and the second DFT 250. By increasing attenuation, the DFT corrector 178 is able to identify magnitude-dependent parasitic components introduced by the LNA 126 and/or other elements. For example, the third DFT 310 reveals that components 270c, 270d, and 270f are no longer present, and that only components 310a and 310g remain.

The DFT corrector 168 applies information from the third DFT 310 to generate further-corrected DFT 350. For example, the DFT corrector 168 normalizes the two DFTs for magnitude, e.g., by multiplying each magnitude value in DFT 310 by a constant equal to the multiplicative inverse of the attenuation ratio between the first and third configurations, such that the third DFT 310 and the corrected DFT 270 are identically scaled. The DFT corrector 168 then identifies magnitude pairs between the corrected DFT 270 and the third DFT 310 and generates the further corrected DFT 350 using corrected magnitude values computed as the minimum of each pair. The resulting further-corrected DFT 350 provides yet a further improvement over the corrected DFT 270 from FIG. 2, and an even larger improvement over the first DFT 210.

Although corrections based on changing center frequency and changing attenuation have been described in separate stages, they may alternatively be performed together. For example, the second configuration may change both center frequency and attenuation, such that the second DFT 250 reflects both sets of changes. Correction may proceed all at once by aligning the two DFTs in frequency, normalizing them in magnitude, and performing pairwise comparisons of resulting magnitude values. It is evident that DFT correction may proceed in a variety of stages and orders, all of which are intended to be encompassed by the invention hereof.

Figure 4A:
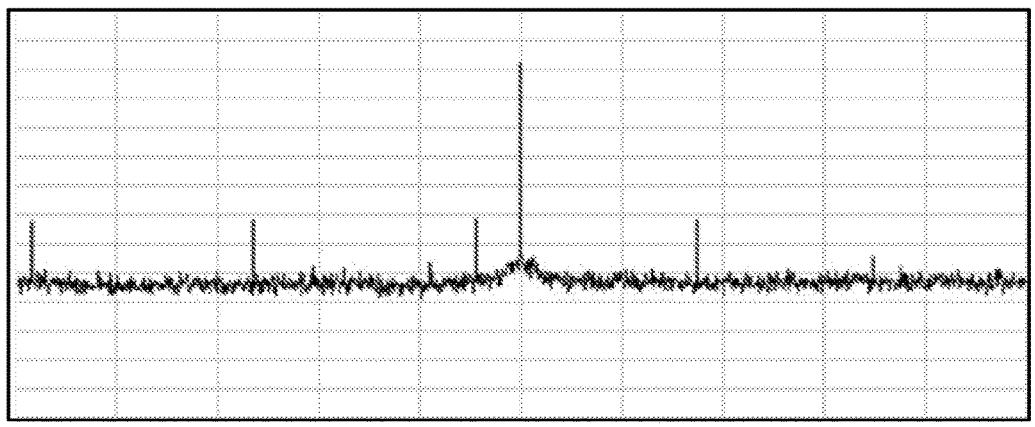
FIGS. 4A and 4B show example screen shots reflecting a DFT before (FIG. 4A) and after (FIG. 4B) correction.
Figure 4B:
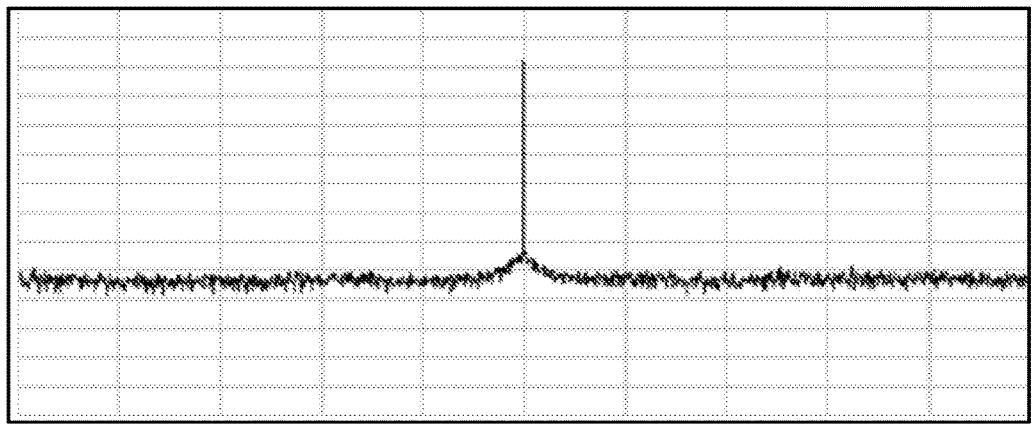

FIGS. 4A and 4B show actual DFT traces obtained using the improved technique both before correction (FIG. 4A) and after correction (FIG. 4B). It can be seen that parasitic components are substantially reduced, revealing a comparatively pure, single tone in the corrected version.

Figure 5:
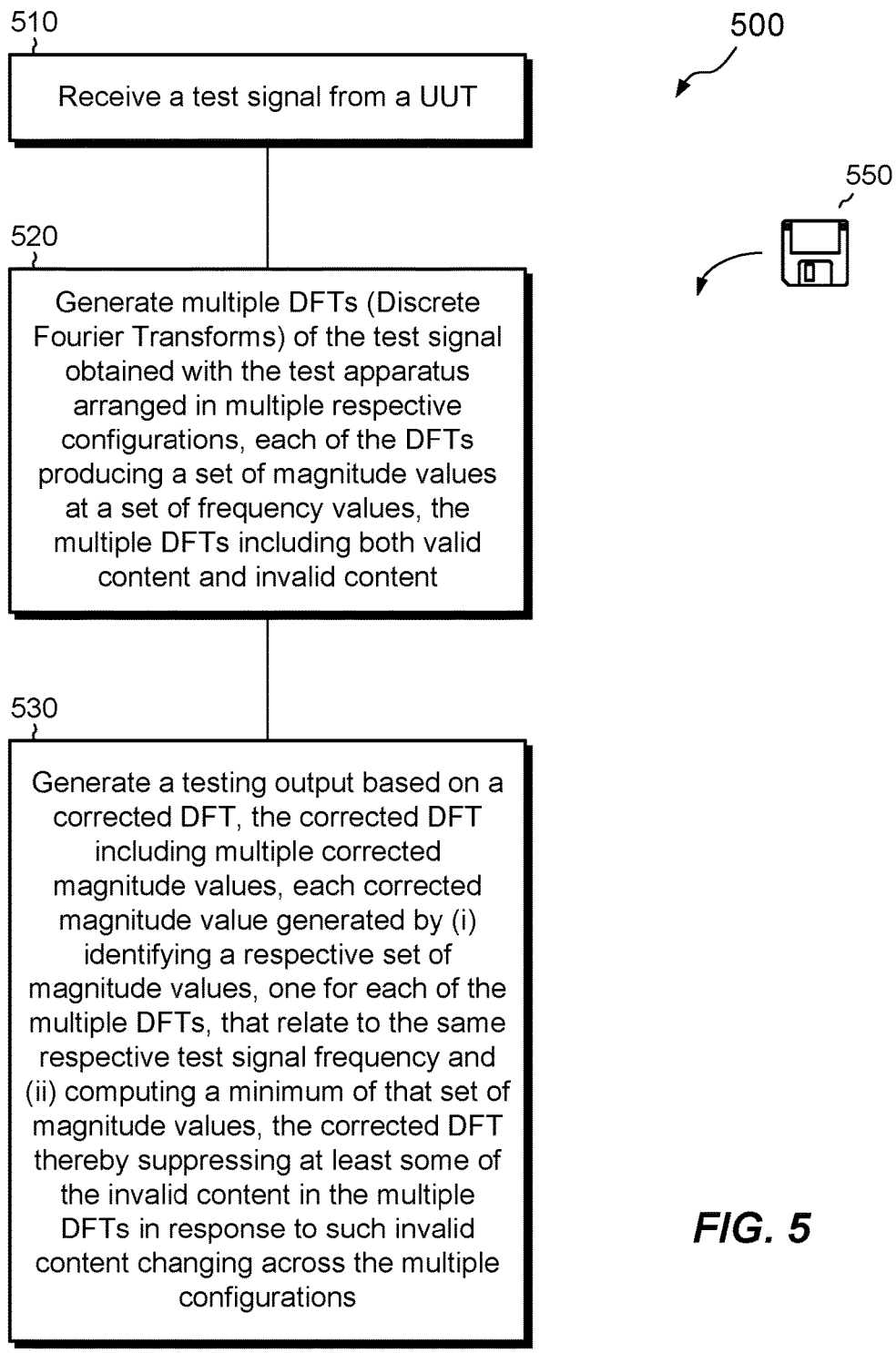
FIG. 5 is a flowchart of an example method of testing an electronic UUT (Unit Under Test) by a test apparatus.

FIG. 5 shows an example process 500 for testing an electronic UUT (Unit Under Test) by a test apparatus. The process 500 may be carried out, for example, by the software constructs which reside in the memory 166 of the controller 160 and are run by the set of processors 164. The various acts of the process 500 may be ordered in any suitable way. Accordingly, embodiments may be constructed in which acts are performed in orders different from those illustrated, which may include performing some acts simultaneously, even though the acts are shown as sequential in the illustrated embodiments.

At 510, the test apparatus 120 receives a test signal 112 from a UUT 110. For example, the UUT 110 may generate the test signal 112 in response to the test apparatus 120 providing power and input stimuli to the UUT 110.

At 520, the test apparatus 120 generates multiple DFTs (Discrete Fourier Transforms) of the test signal 112. The DFTs (e.g., 210, 250, 310) are obtained with the test apparatus 120 arranged in multiple respective configurations. Each of the DFTs produce a set of magnitude values at a set of frequency values (see FIGS. 2 and 3). The multiple DFTs include both valid content and invalid content.

At 530, the test apparatus 120 generates a test result 170 based on a corrected DFT (e.g., 270, 350), the corrected DFT including multiple corrected magnitude values, each corrected magnitude value generated by (i) identifying a respective set of magnitude values, one for each of the multiple DFTs, that relate to the same respective test signal frequency and (ii) computing a minimum of that set of magnitude values, the corrected DFT thereby suppressing at least some of the invalid content in the multiple DFTs in response to such invalid content changing across the multiple configurations.

An improved technique has been described for testing an electronic UUT 110 by a test apparatus 120. The technique includes obtaining multiple DFTs (e.g., 210, 250, 310) of a test signal 112 received from the UUT 110 with the test apparatus 120 that is configured differently for obtaining each DFT. The resulting DFTs include both valid content representing the test signal 112 and invalid content introduced by the test apparatus 120. The improved technique suppresses the invalid content by generating a corrected DFT, which provides minimum magnitude values for corresponding frequencies relative to the test signal across the multiple DFTs.

Having described certain embodiments, numerous alternative embodiments or variations can be made. For example, configuration changes in the test apparatus 120 have been described in terms of LO frequency and attenuation level. However, these are merely examples. Alternatively, other types of configuration changes may be made, to provide different views of the test signal 112, and such different views may be used in a manner similar to that described above to remove invalid content.

Further, although features are shown and described with reference to particular embodiments hereof, such features may be included and hereby are included in any of the disclosed embodiments and their variants. Thus, it is understood that features disclosed in connection with any embodiment are included as variants of any other embodiment.

Further still, the improvement or portions thereof may be embodied as a computer program product including one or more non-transient, computer-readable storage media, such as a magnetic disk, magnetic tape, compact disk, DVD, optical disk, flash drive, SD (Secure Digital) chip or device, Application Specific Integrated Circuit (ASIC), Field Programmable Gate Array (FPGA), and/or the like (shown by way of example as medium 550 in FIG. 5). Any number of computer-readable media may be used. The media may be encoded with instructions which, when executed on one or more computers or other processors, perform the process or processes described herein. Such media may be considered articles of manufacture or machines, and may be transportable from one machine to another.

As used throughout this document, the words "comprising," "including," "containing," and "having" are intended to set forth certain items, steps, elements, or aspects of something in an open-ended fashion. Also, as used herein and unless a specific statement is made to the contrary, the word "set" means one or more of something. This is the case regardless of whether the phrase "set of" is followed by a singular or plural object and regardless of whether it is conjugated with a singular or plural verb. Further, although ordinal expressions, such as "first," "second," "third," and so on, may be used as adjectives herein, such ordinal expressions are used for identification purposes and, unless specifically indicated, are not intended to imply any ordering or sequence. Thus, for example, a second event may take place before or after a first event, or even if no first event ever occurs. In addition, an identification herein of a particular element, feature, or act as being a "first" such element, feature, or act should not be construed as requiring that there must also be a "second" or other such element, feature or act. Rather, the "first" item may be the only one. Although certain embodiments are disclosed herein, it is understood that these are provided by way of example only and that the invention is not limited to these particular embodiments.

Those skilled in the art will therefore understand that various changes in form and detail may be made to the embodiments disclosed herein without departing from the scope of the invention.

What is claimed is:

1. A method of testing an electronic UUT (Unit Under Test) by a test apparatus, the method comprising:
   receiving a test signal from the UUT;
   generating multiple DFTs (Discrete Fourier Transforms) of the test signal obtained with the test apparatus arranged in multiple respective configurations, each of the DFTs producing a set of magnitude values at a set of frequency values, the multiple DFTs including both valid content and invalid content; and
   generating a test result based on a corrected DFT, the corrected DFT including multiple corrected magnitude values, each corrected magnitude value generated by (i) identifying a respective set of magnitude values, one for each of the multiple DFTs, that relate to the same respective test signal frequency and (ii) computing a minimum of that set of magnitude values, the corrected DFT thereby suppressing at least some of the invalid content in the multiple DFTs in response to such invalid content changing across the multiple configurations,
   wherein the test apparatus includes a downconverter having a local oscillator for converting a frequency band of the test signal to lower frequencies, and wherein, when generating the multiple DFTs, the method further comprises:
      arranging the test apparatus in a first configuration, in which the local oscillator generates a local oscillator signal at a first frequency;
      obtaining a first DFT, of the multiple DFTs, with the test apparatus arranged in the first configuration;
      arranging the test apparatus in a second configuration, in which the local oscillator generates the local oscillator signal at a second frequency; and
      obtaining a second DFT, of the multiple DFTs, with the test apparatus arranged in the second configuration.

2. The method of claim 1, wherein the test apparatus further includes a variable attenuator disposed in line with the test signal, and wherein, when generating the multiple DFTs, the method further comprises:
   arranging the test apparatus in a third configuration, in which the variable attenuator provides an attenuation level lower than one used when the first and second DFTs are generated; and
   obtaining a third DFT, of the multiple DFTs, with the test apparatus arranged in the third configuration.

3. The method of claim 2, further comprising, prior to generating the test result, adjusting at least one of the multiple DFTs to account for the variable attenuator having different attenuation levels when different ones of the multiple DFTs are generated.

4. The method of claim 1,
   wherein the test apparatus further includes a variable attenuator disposed in line with the test signal,
   wherein arranging the test apparatus in the first configuration includes setting the variable attenuator to a first attenuation level, and
   wherein arranging the test apparatus in the second configuration includes setting the variable attenuator to a second attenuation level.

5. The method of claim 4, further comprising, prior to generating the test result, adjusting at least one of the multiple DFTs to account for the variable attenuator having different attenuation levels when different ones of the multiple DFTs are generated.

6. The method of claim 1, wherein the multiple DFTs extend over respective frequency ranges, and wherein the frequency ranges of the multiple DFTs include an overlapping range common to all of the multiple DFTs.

7. The method of claim 6, wherein the multiple DFTs are generated with a common sampling frequency, such that intervals between adjacent frequency components are equal across the multiple DFTs.

8. The method of claim 7, wherein the first local oscillator frequency and the second local oscillator frequency differ by an amount equal to an integer number of intervals between adjacent frequency components.

9. A method of testing an electronic UUT (Unit Under Test) by a test apparatus, the method comprising:
   receiving a test signal from the UUT;
   generating multiple DFTs (Discrete Fourier Transforms) of the test signal obtained with the test apparatus arranged in multiple respective configurations, each of the DFTs producing a set of magnitude values at a set of frequency values, the multiple DFTs including both valid content and invalid content; and
   generating a test result based on a corrected DFT, the corrected DFT including multiple corrected magnitude values, each corrected magnitude value generated by (i) identifying a respective set of magnitude values, one for each of the multiple DFTs, that relate to the same respective test signal frequency and (ii) computing a minimum of that set of magnitude values, the corrected DFT thereby suppressing at least some of the invalid content in the multiple DFTs in response to such invalid content changing across the multiple configurations,
   wherein the test apparatus further includes a variable attenuator disposed in line with the test signal, and wherein, when generating the multiple DFTs, the method further comprises:
      arranging the test apparatus in a first configuration, in which the variable attenuator provides a first attenuation level; and
      obtaining a first DFT, of the multiple DFTs, with the test apparatus arranged in the first configuration;

arranging the test apparatus in a second configuration, in which the variable attenuator provides a second attenuation level; and obtaining a second DFT, of the multiple DFTs, with the test apparatus arranged in the second configuration.

10. The method of claim 9, wherein the test apparatus further includes a downconverter having a local oscillator for converting a frequency band of the test signal to lower frequencies, wherein arranging the test apparatus in the first configuration includes setting the local oscillator to generate a local oscillator signal at a first frequency, and wherein, when generating the multiple DFTs, the method further comprises:

arranging the test apparatus in a third configuration, in which the local oscillator generates a local oscillator signal at a second frequency; and obtaining a third DFT, of the multiple DFTs, with the test apparatus arranged in the third configuration.

* * * * *